US006188341B1

United States Patent
Taniguchi et al.

(10) Patent No.: US 6,188,341 B1
(45) Date of Patent: Feb. 13, 2001

(54) ENCODER INTERPOLATION CIRCUIT WHICH CORRECTS AN INTERPOLATION ANGLE BETWEEN A RECEIVED SINE-WAVE ENCODER SIGNAL AND A COSINE-WAVE ENCODER SIGNAL

(75) Inventors: Mitsuyuki Taniguchi, Gotenba; Tadashi Inoue, Oshino-mura, both of (JP)

(73) Assignee: Fanuc Ltd., Yamanashi (JP)

( * ) Notice: Under 35 U.S.C. 154(b), the term of this patent shall be extended for 0 days.

(21) Appl. No.: 09/101,360

(22) PCT Filed: Nov. 11, 1997

(86) PCT No.: PCT/JP97/04102

§ 371 Date: Jul. 8, 1998

§ 102(e) Date: Jul. 8, 1998

(87) PCT Pub. No.: WO98/21553

PCT Pub. Date: May 22, 1998

(30) Foreign Application Priority Data

Nov. 11, 1996 (JP) .................................................. 8-314190

(51) Int. Cl.[7] .............................. H03M 1/06; H03M 1/48
(52) U.S. Cl. ............................................ 341/116; 341/111
(58) Field of Search ..................................... 341/111, 116

(56) References Cited

U.S. PATENT DOCUMENTS

| 5,625,310 | 4/1997 | Takeishi ............................ 318/618 |
| 5,677,686 | 10/1997 | Kachi et al. ......................... 341/115 |
| 5,786,781 | 7/1998 | Taniguchi et al. .................... 341/116 |

FOREIGN PATENT DOCUMENTS

| 44 43 898 | 6/1996 | (DE) . |
| 0 599 175 | 6/1994 | (EP) . |
| 0 669 517 | 8/1995 | (EP) . |
| 3-31720 | 2/1991 | (JP) . |
| 3-223621 | 10/1991 | (JP) . |
| 5-231879 | 9/1993 | (JP) . |
| 7-174586 | 7/1995 | (JP) . |
| 7-198417 | 8/1995 | (JP) . |
| 7-218288 | 8/1995 | (JP) . |
| 8-122097 | 5/1996 | (JP) . |
| 8-145719 | 6/1996 | (JP) . |

OTHER PUBLICATIONS

Institute of Electrical and Electronics Engineers: "A Method of Improving the Resolution and Accuracy of Rotary Encoders Using Code Compensation Technique" Instrumentation and Measurement Technology Conference, US, New York, IEEE, vol. Conf. 8, p. 183–184.

Primary Examiner—Howard L. Williams
(74) Attorney, Agent, or Firm—Staas & Halsey LLP

(57) ABSTRACT

An encoder interpolation circuit for obtaining interpolation data within one wave from two sine-wave encoder signals of different phases comprises interpolative computation means (2) for receiving two sine-wave encoder signals received and carrying out to interpolative computation within one wave, signal deviation detecting means (3) for detecting a deviation of the two sine-wave encoder signals, correction data forming means (4) for outputting correction data corresponding to the detected deviation and the output of the interpolative computation means, and corrective computation means (5) for obtaining the corrected interpolation data by carrying out corrective computation for the output of the interpolative computation means with the correction data and obtaining corrected interpolation data.

18 Claims, 8 Drawing Sheets

ENCODER INTERPOLATION CIRCUIT WHICH CORRECTS AN INTERPOLATION ANGLE BETWEEN A RECEIVED SINE-WAVE ENCODER SIGNAL AND A COSINE-WAVE ENCODER SIGNAL

TECHNICAL FIELD

The present invention relates to an interpolation circuit for interpolating detection signals from an encoder for to thereby detect rotational angles or positions on a straight line.

BACKGROUND ART

In a detecting device for detecting positions of a table and a motor of a machine tool of an NC apparatus, a rotary-type pulse encoder attached to the motor shaft or the like and a linear-type pulse encoder attached to a worktable or the like are known as means for detecting the movement and moving speed of a moving body. As the moving body moves, these encoders generate an A-phase signal, a sine-wave signal (Ksin θ), and a B-phase sine-wave signal (Ksin(θ±π/2)), which has a phase difference of 90° from the A-phase signal, and obtains angle data (θ) by carrying out interpolative computation with use of these two sine-wave signals, thereby improving the resolution for the position and speed.

There are known methods for this interpolation technique, including a method in which a converter circuit for sine- and cosine-wave signals from a signal source is composed of a plurality of resistors and comparator arrays. In another method based on the interpolation circuit configuration shown in FIG. 15, a sine-wave signal $V_A$ and a cosine-wave signal $V_B$ are inputted to the interpolative computation unit 2 after being A/D-converted by unit of A/D converters 1a and 2a, respectively, and the interpolative computation unit 2 computes $\tan^{-1}(V_A/V_B)$ to obtain angle data θ. The computation of this inverse transform of a tangent can be carried out by using a calculation process based on a Taylor expansion, for example.

An interpolation circuit used for a conventional encoder carries out interpolative computation on the assumption that it receives an A-phase signal (sine-wave signal) and a B-phase signal (cosine-wave signal) that are equal in amplitude K and have a phase difference of π/2.

In general, however, A- and B-phase signals that are inputted to an encoder do not always have an accurate phase difference of π/2, and are not always equal in amplitude. In other words, the phase difference between the two signals may be deviated from π/2 or the amplitude ratio may be deviated from 1.

If interpolative computation is carried out with use of these deviated signals, the obtained angle θ may possibly be subject to an interpolation error attributable to the deviation.

Conventionally, therefore, this interpolation error is removed by a method in which an analog regulator circuit is provided in front of A/D converters so that the amplitude ratio between the A- and B-phase signals inputted to the analog regulator circuit can be adjusted to 1 or that phase difference between the A- and B-phase signals can be adjusted to π/2.

However, the removal of the interpolation error by means of the analog regulator circuit requires a complicated circuit configuration. Since the regulator circuit is an analog circuit, moreover, it is necessary to adjust the regulator circuit itself.

DISCLOSURE OF THE INVENTION

The object of the present invention is to provide an interpolation circuit for an encoder, in which interpolation data cleared of an interpolation error that is attributable to signal deviations can be obtained by correcting interpolation data, which is obtained by interpolative computation, without adjusting input signals.

In order to achieve the above object, an encoder interpolation circuit according to the present invention comprises: interpolative computation means for receiving two encoder signals of difference phases, carrying out interpolative computation for these signals and outputting interpolation angle data, correction data forming means for obtaining and outputting correction data corresponding to a combination of a detected deviation of the two encoder signals from a normal waveform and the interpolation angle data outputted from the interpolative computation means; and corrective computation means for correcting the interpolation angle data outputted from the interpolative computation means with the correction data outputted from the correction data forming means and outputting corrected interpolation angle data.

Preferably, the deviation of the two encoder signals is the ratio of the amplitude of one sine-wave encoder signal to the amplitude of the other sine-wave encoder signal.

Preferably, the deviation of the two encoder signals is a phase error as the difference between the predetermined a phase difference between two encoder signals and an actual phase difference between the two encoder signals.

Preferably, the correction data forming means forms the correction data by substituting an output of the interpolative computation means and a detected phase error, as a deviation of the two encoder signals, individually for variables in a computational expression for obtaining preset correction data and operating the computational expression.

Preferably, the correction data forming means is previously stored with the value of correction data for a combination of the output of the interpolative computation means and the output of the correction data forming means, and the correction data forming means receives the output of the interpolative computation means and the output of the correction data forming means and outputs the correction data corresponding to the combination of these outputs.

Preferably, the correction data stored in the correction data forming means can be fetched with an address which represents a combination of the output of the interpolative computation means and the output of the correction data forming means.

Further preferably, the correction data forming means is stored with a data table so that corresponding data can be fetched with an address which represents a combination of angle data in a limited range and a detected signal deviation, and the correction data forming means includes means for receiving the detected deviation of the two encoder signals and the output of the interpolative computation means, and determining an address based on the deviation and the output, and means for forming the correction data by accessing said data table to fetch the corresponding data with the determined address and processing the fetched data.

According to the present invention, interpolation data cleared of an interpolation error that is attributable to signal deviations can be obtained by correcting interpolation data, which is obtained by interpolative computation, without adjusting input signals.

BEST MODE FOR CARRYING OUT THE INVENTION

[Outline of Encoder Interpolation Circuit]

Figure 1:
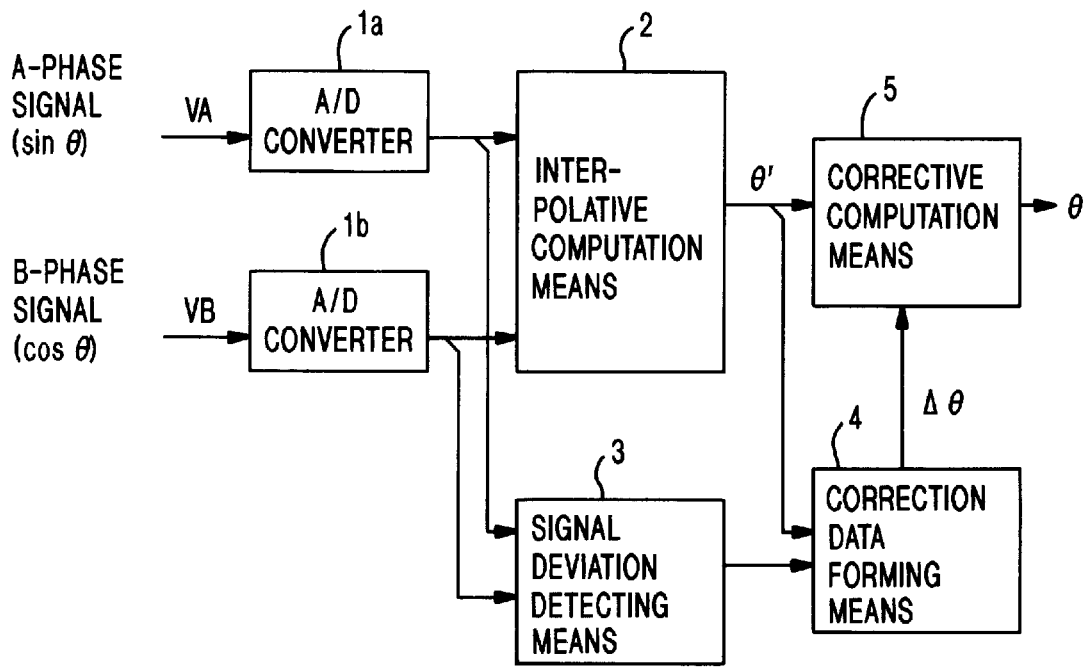
FIG. 1 is a block diagram for illustrating an outline of an encoder interpolation circuit according to the present invention.

Referring first to the block diagram of FIG. 1, an outline of an interpolation circuit for an encoder according to the present invention will be described.

One encoder signal (A-phase signal; sine-wave signal) $V_A$ and another encoder signal (B-phase signal; cosine-wave signal) $V_B$ having the same amplitude as and a phase difference of 90 degrees from $V_A$ are converted from analog signals into digital signals by A/D converters 1a and 1b, respectively. The A-phase signal $V_A$ and the B-phase signal $V_B$, converted into the digital signals by the A/D converters 1a and 1b, are inputted to the interpolative computation means 2. The interpolative computation unit 2 computes $$\theta' = \tan^{-1}(V_A/V_B),$$

and outputs interpolation data $\theta'$. The interpolation data $\theta'$ includes an error (interpolation error $\delta\theta$) that depends on a deviation in amplitude between the A-phase signal $V_A$ and the B-phase signal $V_B$ or a deviation in phase difference.

The A-phase signal $V_A$ and the B-phase signal $V_B$, converted into the digital signals by the A/D converters 1a and 1b, are also inputted to the signal deviation detecting unit 3, whereupon deviations (differences in amplitude or phase) between the A-phase signal $V_A$ and the B-phase signal $V_B$ are detected.

Correction data forming unit 4 receives the output (interpolation data $\theta'$) of the interpolative computation unit 2 and the output of the signal deviation detecting unit 3, and obtains correction data $\Delta\theta$ from these data.

Receiving the output $\theta'$ of the interpolative computation unit 2 and the output $\Delta\theta$ of the correction data forming unit 4, corrective computation means 5 calculates $$\theta = \theta' + \Delta\theta,$$

and outputs interpolation data $\theta$ that includes no interpolation error.

[Case in which the signal deviation between the A- and B-phase signals $V_A$ and $V_B$ is detected by the amplitude difference between the two signals]

Referring now to FIGS. 2 to 8, there will be described a case in which a signal deviation to be detected by the signal deviation detecting unit 3 of FIG. 1 is the amplitude difference between the A-phase signal $V_A$ and the B-phase signal $V_B$, specifically.

(First Embodiment)

Figure 2:
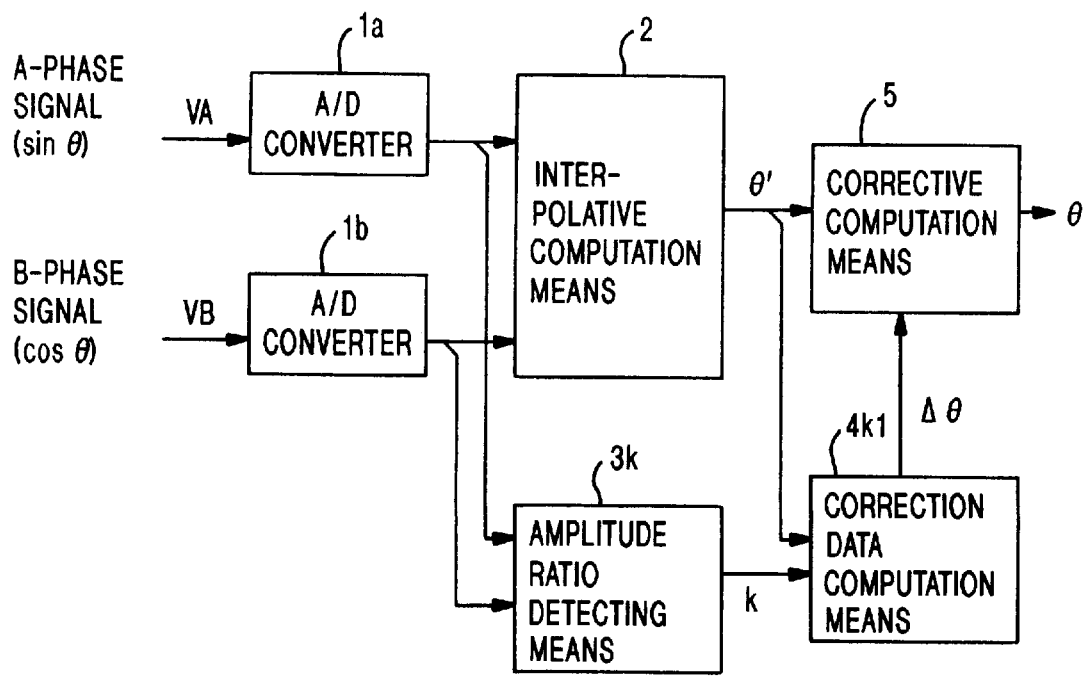
FIG. 2 is a block diagram for illustrating an encoder interpolation circuit according to a first embodiment of the present invention.

Referring now to the block diagram of FIG. 2, there is explained a first embodiment of the encoder interpolation circuit for this case. The encoder interpolation circuit shown in the block diagram of FIG. 2 has the same configuration as the encoder interpolation circuit shown in the block diagram of FIG. 1, except that, in this embodiment, the signal deviation detecting unit 3 of the encoder interpolation circuit shown in the block diagram of FIG. 1 is replaced with the amplitude ratio detecting unit 3k. Accordingly, description of other components than the amplitude ratio detecting unit 3k in the encoder interpolation circuit of FIG. 2 will be omitted. The interpolative computation unit 2 receives the respective outputs of the A/D converters 1a and 1b, that is, the A-phase signal $V_A$ and the B-phase signal $V_B$ converted into the digital signals, and executes interpolative computation within one wave (section from 0 to $2\pi$).

Figure 4:
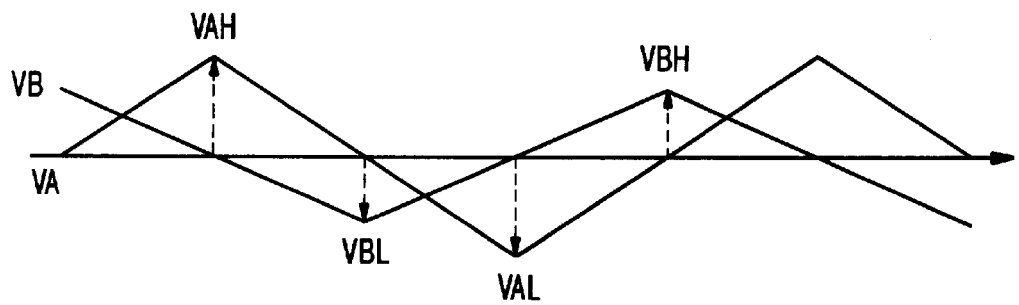
FIG. 4 is a diagram for illustrating an amplitude ratio between two encoder signals.

Referring now to FIG. 4, an amplitude ratio k between the two encoder signals $V_A$ and $V_B$ will be described. For simplicity of illustration in FIG. 4, the encoder signal $V_A$ as a sine-wave signal and the B-phase signal $V_B$ as a cosine-wave signal are represented by a triangular wave each. It is supposed that there is an exact phase difference of $\pi/2$ between these two encoder signals $V_A$ and $V_B$. However, it is supposed that the two signals $V_A$ and $V_B$ are not equal in amplitude.

Referring to FIG. 4, if the values of the encoder signals $V_A$ at a zero-cross time point for the encoder signal $V_B$ are $V_{AH}$ and $V_{AL}$, and if the values of the encoder signals $V_B$ at zero-cross time points for the encoder signal $V_A$ are $V_{BH}$ and $V_{BL}$, the amplitude ratio k is given by the following expressions.

If $(V_{AH} - V_{AL}) > (V_{BH} - V_{BL})$ is given, we obtain $C_{AB} = 0,$ $k = (V_{AH} - V_{AL})/(V_{BH} - V_{BL}).$ \hfill (1)

If $(V_{AH} - V_{AL}) < (V_{BH} - V_{BL})$ is given, we obtain $C_{AB} = 1,$ $k = (V_{BH} - V_{BL})/(V_{AH} - V_{AL}).$ \hfill (2)

In the above equations, $C_{AB}$ is a comparison flag that indicates the result of comparison between the respective amplitudes of the encoder signals $V_A$ and $V_B$. $C_{AB}=0$ represents the case where the amplitude of the signal $V_A$ is greater than the amplitude of the signal $V_B$, while $C_{AB}=1$ represents the case where the amplitude of the signal $V_A$ is smaller than the amplitude of the signal $V_B$.

The amplitude ratio data k and the state of the flag $C_{AB}$ can be obtained by monitoring the values of the A/D converters 1a and 1b, sampling one of the values at a time when the other of the values turns to be zero and calculating a mean value of the sampled data.

Figure 5:
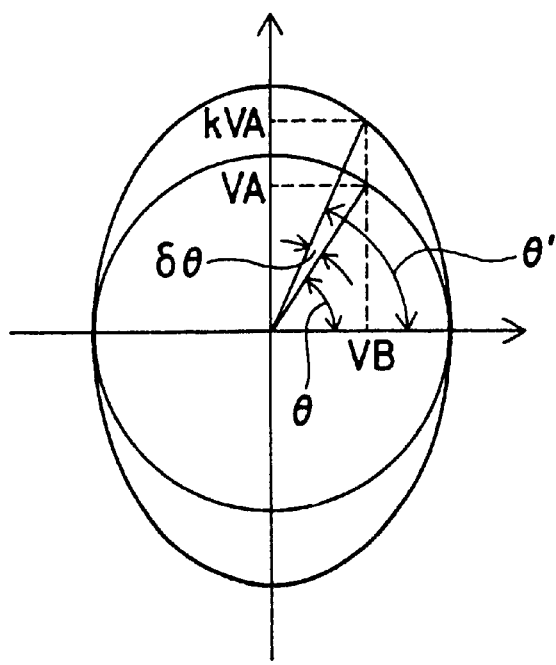
FIG. 5 is a diagram for illustrating an error included in interpolation data when the amplitude difference between the two encoder signals is deviated from $\pi/2$.

If the amplitude ratio k between the two encoder signals $V_A$ and $V_B$ is 1, each of these two signals $V_A$ and $V_B$ is represented by one point on a circle that is described around the origin of a rectangular coordinate system, as shown in FIG. 5. Thus, the value for the axis of abscissa corresponding to the one point on the circle is $V_B$, the value for the axis of ordinate is $V_A$, and the angle of a straight line that connects this point and the origin is given as angle data θ. If the amplitude of the encoder signal $V_A$ is greater than the amplitude of the encoder signal $V_B$ so that k is not at 1, each of these signals $V_A$ and $V_B$ is represented by one point on an ellipse, not a circle. If the amplitude of the signal $V_A$ is greater than the amplitude of the signal $V_B$, as shown in FIG. 5, when the one of the encoder signals is $V_B$, for example, the other of the encoder signals is $kV_A$ (k>1), not $V_A$. The angle of a straight line that connects the one point ($V_B$, $kV_A$) on the ellipse and the origin is given as the interpolation data θ'. Inevitably, therefore, the interpolation data θ' is computed in accordance with the signals $kV_A$ and $V_B$. As shown in FIG. 5, the interpolation data θ' includes an error (interpolation error), δθ (=θ'−θ).

Figure 6:
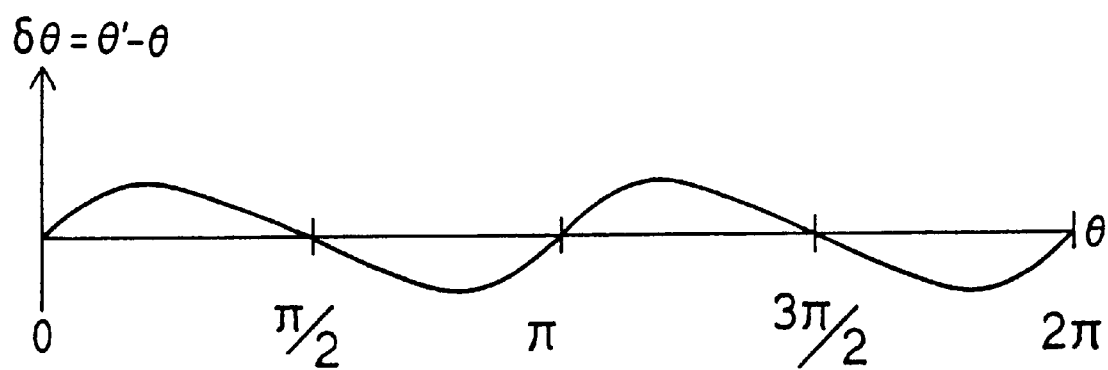
FIG. 6 is a diagram schematically showing a pattern of an error included in computed interpolation data as the amplitude ratio between the two encoder signals is deviated from 1.

If there is exact phase difference of π/2 between the two of the encoder signals $V_A$ and $V_B$, that is, if the one and the other of the encoder signals $V_A$ and $V_B$ are sine- and cosine-wave signals, respectively, the interpolation data θ shown in FIG. 5 and the interpolation error δθ have the relation shown in FIG. 6, for example. Referring to FIG. 6, a pattern of δθ within the range of θ=0 to π/2 is the same as a pattern of δθ within the range of θ=π to 3 π/2. Further, a pattern of δθ within the range of θ=π/2 to π is the same as a pattern of δθ within the range of θ=3 π/2π to 2π. Furthermore, the pattern of δθ within the range of θ=π/2 to π and the pattern of δθ within the range of θ=0 to π/2 are in point symmetry with respect to a point θ=π/2.

The following is a description of the correction data Δθ for the interpolation data θ' that includes the interpolation error in the case where amplitude ratio between the sine-wave encoder signal (A-phase signal) and the cosine-wave encoder signal (B-phase signal) is at k (≠1).

Using the A-phase signal (hereinafter designated by $kV_A$) and the B-phase signal (hereinafter designated by $V_B$), the interpolation data θ' that includes the interpolation error is given by $$θ'=\tan^{-1}(kV_A/V_B), \quad (3)$$

From the above expression (3), the following expressions are obtained.

$$kV_A/V_B=\sin θ'/\cos θ', \quad (4)$$

$$V_A/V_B=\sin θ'/k\cos θ'. \quad (5)$$

On the other hand, the interpolation data θ that includes no interpolation error with k=1 is given by $$θ=\tan_{-1}(V_A/V_B), \quad (6)$$

Accordingly, the correction data Δθ can be represented as follows:

$$Δθ=θ−θ'=\tan^{-1}(\sin θ'/k\cos θ')−θ' \quad (7)$$

The above expression (7) indicates that the correction data Δθ can be obtained from the interpolation data θ' that includes the interpolation error and the amplitude ratio k.

Based on the interpolation data θ' received from the interpolative computation unit 2 and the amplitude ratio k received from the amplitude ratio detecting unit 3k, therefore, correction data computation unit 4k1 of FIG. 2 carries out computation according to the aforesaid expression (7), and obtains and outputs the correction data Δθ.

Based on the interpolation data θ' received from the interpolative computation unit 2 and the correction data Δθ received from correction data storage unit 4k1, therefore, the corrective computation unit 5 calculates $$θ=θ'+Δθ, \quad (8)$$

and outputs the interpolation data θ obtained by correcting the interpolation error δθ.

(Second Embodiment)

In the first embodiment shown in FIG. 2, the correction data Δθ is obtained by the computation of expression (7) by the correction data computation unit 4k1. Instead of obtaining the correction data Δθ by this computation, however, the correction data Δθ corresponding to a combination of the input value θ' and k may be read out after previously storing the correction data storage unit with the relation between the input value (θ', k) and the correction data Δθ corresponding to this input value in the form of a table.

Figure 3:
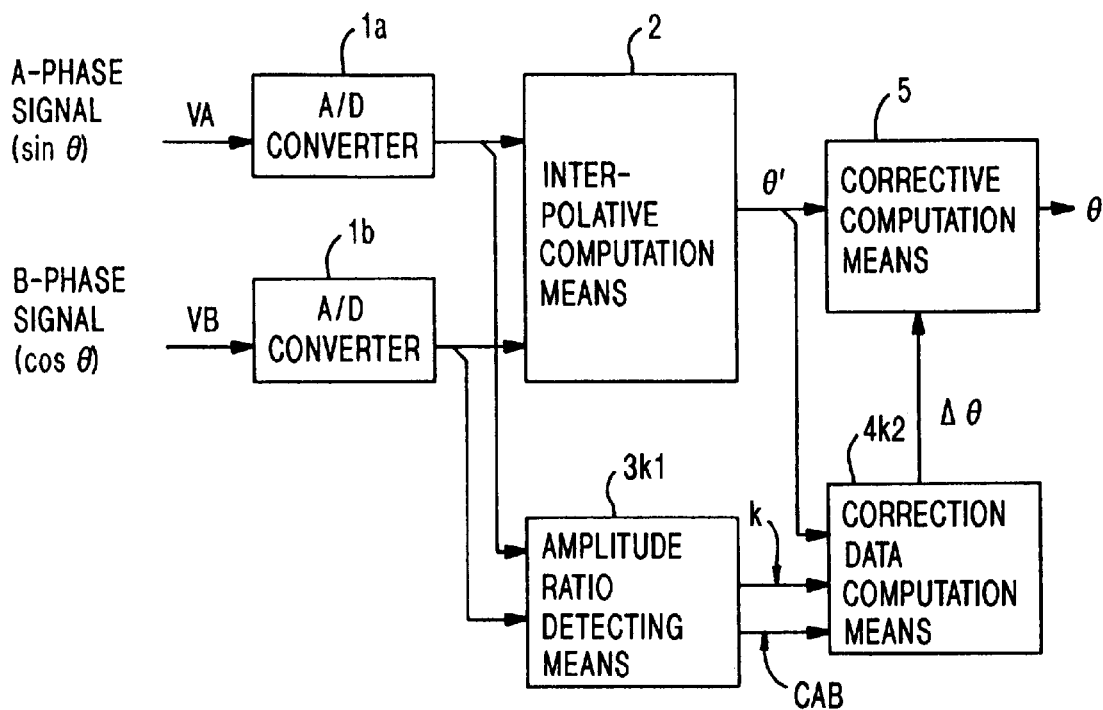
FIG. 3 is a block diagram for illustrating an encoder interpolation circuit according to a second embodiment of the present invention.

Referring now to the block diagram of FIG. 3, there is shown an encoder interpolation circuit according to a second embodiment, which is provided with the aforesaid correction data storage unit in place of the correction data computation unit 4k1.

The encoder interpolation circuit shown in the block diagram of FIG. 3 has the same configuration as the encoder interpolation circuit shown in the block diagram of FIG. 2, except that, in this embodiment, the correction data computation unit 4k1 of the encoder interpolation circuit shown in the block diagram of FIG. 2 is replaced with correction data storage unit 4k2. Accordingly, description of other components than the correction data computation unit 4k1 in the encoder interpolation circuit shown in the block diagram of FIG. 3 will be omitted.

The correction data storage unit 4k2 is stored with correction data Δθ corresponding to combinations (k, θ') of various amplitude ratios k and the interpolation data θ'. The correction data storage means 4k2 receives the amplitude ratios k and the interpolation data θ' from the interpolative computation unit 2 and amplitude ratio detecting unit 3k1, and reads out the correction data Δθ according to the address (k, θ').

A large storage capacity is needed to load the correction data storage unit 4k2 with the correction data to cope with all the possible combinations of the amplitude ratios k and the interpolation data θ'. However, there is a method in which correction data can be fetched for all the possible combinations of the amplitude ratios k and the interpolation data θ' even if the range of the interpolation data θ' and the amplitude ratios k are limited to reduce the quantity of data to be stored in the correction data storage unit 4k2 correspondingly. The following is a description of this method.

As mentioned before with reference to FIGS. 5 and 6, from the pattern of the interpolation error δθ within the range of the interpolation data θ=0 to π/2 (first quadrant), the pattern of the interpolation error δθ within the range of the interpolation data θ=π/2 to π (second quadrant), the pattern of the interpolation error δθ within the range of the interpolation data θ=π to 3π/2 (third quadrant), and the pattern of the interpolation error δθ within the range of the interpolation data θ=3π/2 to 2π (fourth quadrant) can be obtained individually. Therefore, regarding the correction data Δθ for canceling the interpolation error δθ, it is sufficient to store only the pattern of the correction data Δθ within the range of the interpolation data θ' (output of the interpolative computation unit 2)=0 to π/2 (first quadrant). The quantity of data stored in the correction data storage unit 4 can be reduced by the storage of the correction data within this limited range.

If the value of the interpolation error δθ is small, the value of the interpolation error δθ and the amplitude ratio k can be considered to be substantially in proportion to each other. Accordingly, only correction data Δθ0 for a specific amplitude ratio k0 is stored in advance so that correction data Δθn for other amplitude ratios kn can be obtained by multiplying the correction data for the specific amplitude ratio k0 by the percentage of the amplitude ratio. Thus, the number of amplitude ratios k to be stored in the correction data storage unit 4k2 can be limited to reduce the quantity of correction data stored.

Figure 7:
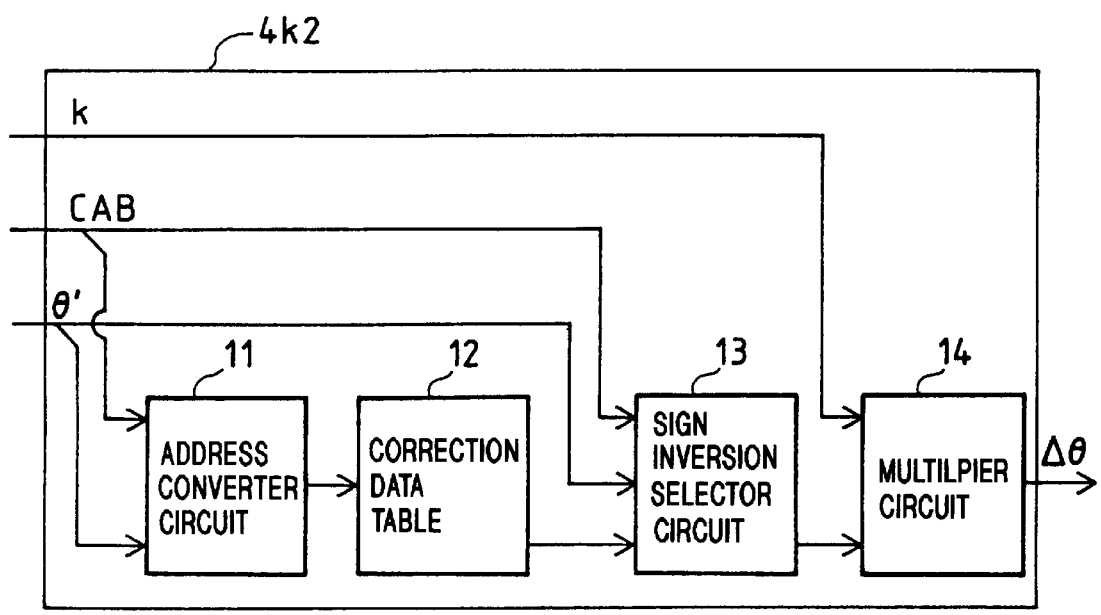
FIG. 7 is a block diagram for illustrating elements constituting correction data storage means in the encoder interpolation circuit of FIG. 3.

The block diagram of FIG. 7 illustrates the configuration of the correction data storage unit 4k2 for limiting the range of the interpolation data θ' and the amplitude ratios k and storing the correction data. The correction data storage unit 4k2 comprises an address converter circuit 11, correction data table 12, sign inversion selector circuit 13, and multiplier circuit 14. The address converter circuit 11 receives the interpolation data θ' and the comparison flag $C_{AB}$ and forms addresses. The correction data table 12 is loaded only with the correction data corresponding to combinations of the interpolation data θ' in the limited range and the limited amplitude ratios k, and the correction data are read out from the table 12 in response to address assignment by unit the address converter circuit 11. The sign inversion selector circuit 13 inverts the sign of the read correction data in accordance with the computed interpolation data θ' and the comparison flag $C_{AB}$. The multiplier circuit 14 multiplies the correction data by the detected amplitude ratio k.

Figure 8:
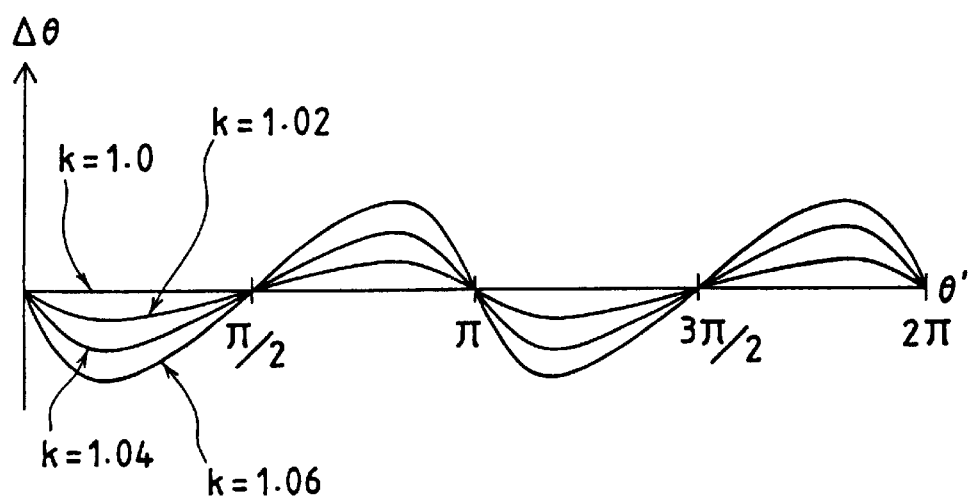
FIG. 8 is a diagram schematically showing correction data patterns for canceling the error shown in FIG. 6, according to the amplitude ratio.

FIG. 8 shows the relation between the correction data Δθ and the interpolation data θ' represented for each amplitude ratio k. Referring to FIG. 8, each correction data Δθ has a size and sign which cancel the interpolation error δθ based on the amplitude ratio k shown in FIG. 6. A pattern of Δθ within the range of the interpolation data θ'=0 to π/2 is the same as a pattern of Δθ within the range of θ'=π to 3π/2. Further, a pattern of Δθ within the range of θ'=π/2 to π is the same as a pattern of Δθ within the range of θ'=3π/2π to 2π. Furthermore, the pattern of Δθ within the range of θ'=π/2 to π and the pattern of Δθ within the range of θ'=0 to π/2 are symmetrical with respect to a point θ=π/2. Accordingly, only the patterns of Δθ within the range of θ'=0 to π/2 are stored, and the correction data within the range of the correction data θ'=π/2 to 2π can be obtained from the patterns of Δθ within the range of the interpolation data θ'=0 to π/2.

Further, the correction data Δθ, which changes its size depending on the amplitude ratio k, can be considered to be substantially proportional to the percentage of the amplitude ratio k when the amplitude ratio k is low. The correction data Δθ is stored as a representative value for the specific amplitude ratio k, and the other amplitude ratios k can be obtained by multiplication.

FIG. 8 illustratively shows cases for k=1.0, k=1.02, k=1.04, and k=1.06. For example, only the correction data Δθ for k=1.02 is stored, and the other amplitude ratios k can be obtained by multiplying the correction data Δθ by the ratio to k=1.02 as a multiplication factor. Here k=1.0 indicates that the respective amplitudes of the two encoder signals are equal.

The address converter circuit 11 is a circuit that receives the computed interpolation data θ' and the comparison flag $C_{AB}$, and forms addresses for reading out the correction data table 12. In forming the addresses, the addresses are outputted depending on the range of the inputted interpolation data θ' and the sign, positive or negative, of the comparison flag $C_{AB}$, with 0≦θ'<π/2 as a unit, as shown in Table 1 below.

The sign inversion selector circuit 13 does or does not invert the sign of the data read out from the correction data table 12, depending on the range of the computed interpolation data θ' and the sign, positive or negative, of the comparison flag $C_{AB}$, as shown in Table 1.

TABLE 1

| θ' | Comparison Flag $C_{AB}$ | Address to Data Table | Sign of Output Data |
| --- | --- | --- | --- |
| 0 ≦ θ' < π/2 | 0 (A > B) | θ' | Non-inverted |
|  | 1 (A < B) | π/2 − θ' | Inverted |
| π/2 ≦ θ' < 0 | 0 (A > B) | π − θ' | Inverted |
|  | 1 (A < B) | θ' − π/2 | Non-inverted |
| π ≦ θ' < 3π/2 | 0 (A > B) | θ' − π | Non-inverted |
|  | 1 (A < B) | 3π/2 − θ' | Inverted |
| 3π/2 ≦ θ' < 2π | 0 (A > B) | 2π − θ' | Inverted |
|  | 1 (A < B) | θ' − 3π/2 | Non-inverted |

Further, the multiplier circuit 14 is a circuit that multiplies the correction data stored for the specific amplitude ratio k by a multiplication factor of a percentage corresponding to the current amplitude ratio k. Table 2 below shows examples of the multiplication factor. The correction data is stored in advance as a reference for the amplitude ratio k=1.02, and different amplitude ratios k are obtained by multiplication by specific multiplication factors on the basis of the amplitude ratio k=1.02 as a reference.

TABLE 2

| Amplitude Ratio K | Multiplication Factor |
| --- | --- |
| 1.00 ≦ k < 1.01 | 0 |
| 1.01 ≦ k < 1.03 | 1 |
| 1.03 ≦ k < 1.05 | 2 |
| 1.05 ≦ k < 1.07 | 3 |
| 1.07 ≦ k | 4 |

In the case where the amplitude ratio k ranges from 1.03 to 1.05, for example, the correction data for the amplitude ratio k=1.02 is multiplied by a multiplication factor of 2. In the case where the amplitude ratio k ranges from 1.05 to 1.07, the correction data Δθ is obtained by multiplying the correction data for the amplitude ratio k=1.02 by a multiplication factor of 3.

In a method of multiplication in the multiplier circuit 14, moreover, the correction data Δθ may be obtained by determining the multiplication factor in a manner such that the correction data table 12 is stored with only correction data for a specific amplitude ratio k1 in the case where the amplitude of the one encoder signal is greater than the amplitude of the other encoder signal, and the correction data is multiplied by (1−k)/(1−k1) when the detected amplitude ratio k is higher than 1 or multiplied by —(1−k)/(1−k1) when the detected amplitude ratio k is lower than 1.

In a method of multiplication in the multiplier circuit 14, furthermore, the correction data Δθ may be obtained by determining the multiplication factor in a manner such that the correction data table 12 is stored with first correction data for a specific amplitude ratio k1 in the case where the amplitude of the one encoder signal is greater than the amplitude of the other encoder signal, and second correction data for a specific amplitude ratio k2 in the case where the amplitude of the one encoder signal is smaller than the amplitude of the other encoder signal, and the first correction data is multiplied by (1−k)/(1−k1) when the detected amplitude ratio k is higher than 1, while the second correction data is multiplied by (1−k)/(1−k2) when the detected amplitude ratio k is lower than 1.

[Case in which the signal deviation between the A- and B-phase signals $V_A$ and $V_B$ is detected by the phase difference between the two signals]

Referring now to FIGS. 9 to 14, there will be described an encoder interpolation circuit for correcting an interpolation error based on the phase error between the two encoder signals.

(First Embodiment)

Figure 9:
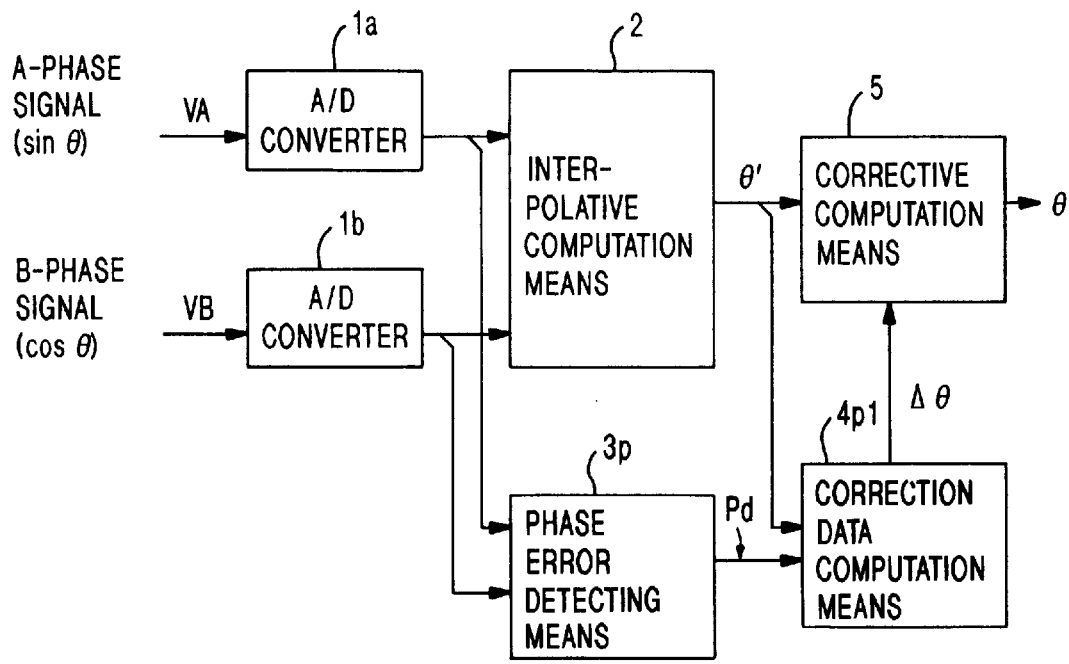
FIG. 9 is a block diagram for illustrating an encoder interpolation circuit according to a third embodiment of the present invention.

Referring to the block diagram of FIG. 9, there is shown a first embodiment of the encoder interpolation circuit for this case. The encoder interpolation circuit shown in the block diagram of FIG. 9 has the same configuration as the encoder interpolation circuit shown in the block diagram of FIG. 1, except that, in this embodiment, the signal deviation detecting means 3 of the encoder interpolation circuit shown in the block diagram of FIG. 1 is replaced with phase error detecting means 3p. Accordingly, a description of other components than the phase error detecting means 3p of the encoder interpolation circuit shown in the block diagram of FIG. 9 will be omitted.

Figure 11:
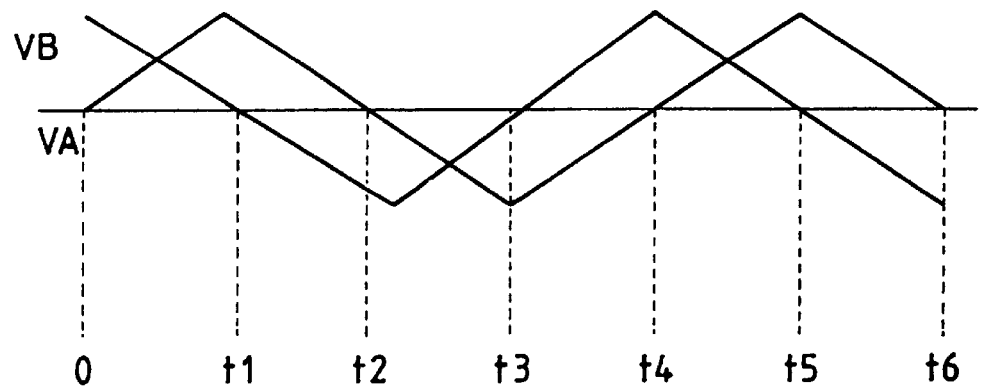
FIG. 11 is a diagram for illustrating phase errors between two encoder signals.

Referring now to FIG. 11, the phase error between the two encoder signals will be described. In FIG. 11, the sine- and cosine-wave signals are simplified in the form of triangular waves and are designated by $V_A$ and $V_B$, respectively. Although these two encoder signals $V_A$ and $V_B$ are equal in amplitude, it is supposed that their phase difference is deviated from π/2 (that is, a phase error exists).

For detecting a phase error Pd between these two encoder signals $V_A$ and $V_B$, a zero-cross point for the encoder signal $V_A$ is selected as a starting point and then the times t1, t2, t3, t4 and t5 at the zero-cross points for the signals are measured. Thereupon, the phase error Pd can be obtained as follows:

Phase difference P1={(t1+t3)/2−t2/2}/t4×2π,  (9)

Phase difference P2={(t3+t5)/2−(t2/2+t4/2)}/t4×2π,  (10)

Phase difference P=(P1+P2)/2,  (11)

Phase error Pd=P−t4/4×2π.  (12)

Although the average of the phase differences P0 and P2 is obtained according to the above expression in order to improve the detection accuracy, the phase error may be also obtained from the phase difference P1 only.

In obtaining the foregoing phase error Pd, measurement has to be is made in a state such that the moving speed of an object to be detected is so stable that variation in the speed during the time from t1 to t5 is negligible. Further, the phase error is obtained by calculating a mean value after sampling data during a plurality of cycles of input signals.

Figure 12:
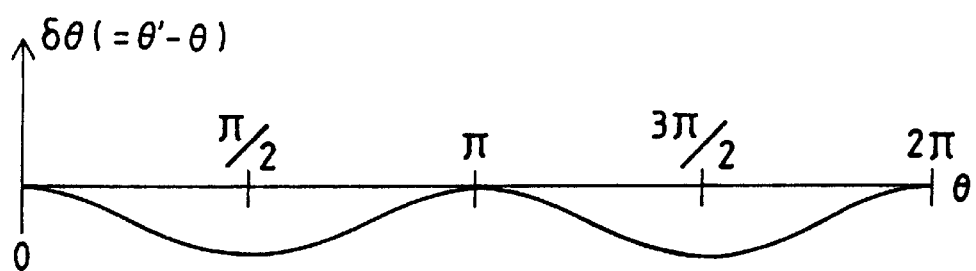
FIG. 12 is a diagram schematically showing a pattern of an error included in computed interpolation data as the phase difference between the two encoder signals is deviated from $\pi/2$.

If the two encoder signals $V_A$ and $V_B$ are deviated from the phase difference of π/2 (i.e., if an error in the phase difference is produced), the error δθ included in the interpolation data θ' computed based on the signals $V_A$ and $V_B$ has a pattern such as the one shown in the diagram of FIG. 12. FIG. 12 schematically shows the relation between the error δθ and real angle data θ that does not include the error δθ. A pattern of the error δθ within the range of the angle data θ=0 to π and a pattern of the error δθ within the range of the angle data θ=π to 2π are bisymmetrical with respect to a point θ=π.

It is supposed that the phase difference between the two encoder signals is deviated from π/2 by Pd, so that the interpolation data θ', deviated from the real value θ by Δθ, is given when an interpolative computation is carried out for these encoder signals. In order to cancel the interpolation error δθ, therefore, the correction data Δθ is given to the interpolation data θ'.

In this case, the following expression is established among the interpolation data θ' that includes the interpolation error δθ, real angle θ, and phase error Pd:

$$\theta'=\tan^{-1}(\sin\theta/\cos(\theta-Pd)). \quad (13)$$

Accordingly, we obtain $$\sin\theta'/\cos\theta' = \sin\theta/\cos(\theta - Pd) \quad (14)$$
$$= \sin\theta/\{\cos\theta\cdot\cos(Pd) + \sin\theta\cdot\sin(PD)\}.$$

From expression (14), we obtain $$\sin\theta/\cos\theta=\sin\theta'\cdot\cos(Pd)/(\cos\theta'-\sin\theta'\cdot\sin(Pd)). \quad (15)$$

Accordingly, the real angle θ is given by the following expression:

$$\theta=\tan^{-1}\{(\sin\theta'\cdot\cos(Pd)/(\cos\theta'-\sin\theta'\cdot\sin(Pd))\}. \quad (16)$$

Based on the above expression (16), the correction data Δθ is given by the following expression:

$$\Delta\theta = \theta - \theta' \quad (17)$$
$$= \tan^{-1}\{(\sin\theta'\cdot\cos(Pd)/(\cos\theta' - \sin\theta'\cdot\sin(Pd))\} - \theta'.$$

The above expression (17) indicates that the correction data Δθ can be obtained from the phase error Pd and the interpolation data θ' that includes the interpolation error δθ.

Thereupon, correction data computation means 4p1 of FIG. 9 carries out computation based on the aforesaid expression (17) in accordance with the interpolation data θ' received from the interpolative computation means 2 and the phase error Pd received from the phase error detecting means 3p, and obtains and outputs the correction data Δθ.

Based on the interpolation data θ' received from the interpolative computation means 2 and the correction data Δθ received from the correction data computation unit 4p1, therefore, the corrective computation means 5 of FIG. 9 calculates $$\theta=\theta'+\Delta\theta, \quad (18)$$

and outputs the real angle, that is, the interpolation data θ, obtained after the correction of the interpolation error δθ.

(Second Embodiment)

In the first embodiment shown in FIG. 9, the correction data Δθ is obtained by the computation of expression (17) by unit of the correction data computation means 4p1. Correction data storage means 4p2 may be used in place of the correction data computation means 4p1 for this computation. An encoder interpolation circuit according to this second embodiment is shown in the block diagram of FIG. 10.

Figure 10:
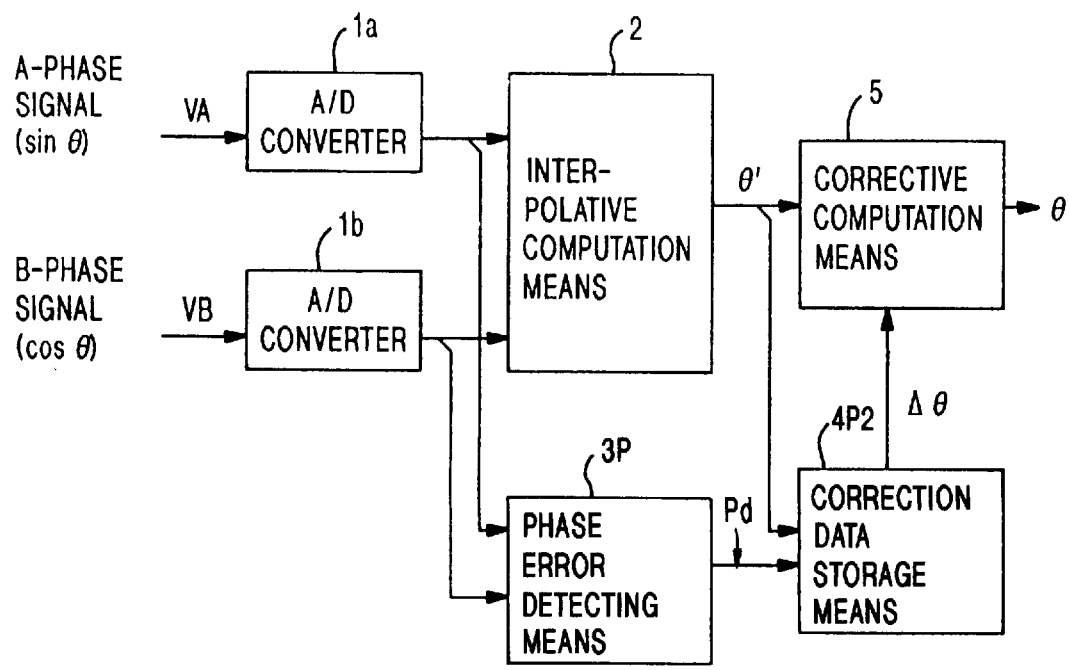
FIG. 10 is a block diagram for illustrating an encoder interpolation circuit according to a fourth embodiment of the present invention.

The encoder interpolation circuit shown in the block diagram of FIG. 10 has the same configuration as the encoder interpolation circuit shown in the block diagram of FIG. 9, except that, in this embodiment, the correction data computation unit 4p1 of the encoder interpolation circuit shown in the block diagram of FIG. 9 is replaced with the correction data storage unit 4p2. Accordingly, a description of other components than the correction data storage means 4p2 in the encoder interpolation circuit of FIG. 10 will be omitted.

The correction data storage unit 4p2 is stored with correction data $\Delta\theta$ corresponding to combinations (Pd, $\theta'$) of various phase errors Pd and the interpolation data $\theta'$. The correction data storage unit 4p2 receives the phase errors Pd and the interpolation data $\theta'$ from the interpolative computation unit 2 and the phase error detecting unit 3p, and reads out the correction data $\Delta\theta$ according to the address (Pd, $\theta'$).

A large storage capacity is required for loading the correction data $\Delta\theta$ so as to cope with all the possible combinations of the phase errors Pd and the interpolation data $\theta'$. There is a method in which the correction data can be fetched for all the possible combinations of the phase errors Pd and the interpolation data $\theta'$ even if the range of the interpolation data $\theta'$ and the phase errors Pd are limited to reduce the quantity of data to be stored in the correction data storage unit 4p2 correspondingly. The following is a description of this method.

As shown in FIG. 12, the pattern of the interpolation error $\delta\theta$ within the range of the angle data $\theta=0$ to $\theta$ and the pattern of the interpolation error $\delta\theta$ within the range the angle data $\theta=\pi$ to $2\pi$ are symmetrical with respect to $\theta=\pi$. Accordingly, regarding the correction data $\Delta\theta$ for canceling the interpolation error $\delta\theta$ included in the interpolation data $\theta'$, it is sufficient to store in the correction data storage unit 4p2 only the correction data $\Delta\theta$ within the range of the interpolation data $\theta'=0$ to $\pi$. Within the range of the interpolation data $\theta'=\pi$ to $2\pi$, corresponding correction data $\Delta\theta$ can be obtained by utilizing the symmetry with the data stored in the correction data storage unit 4p2. The quantity of stored correction data can be reduced by limiting the range of the interpolation data $\theta'$ to be stored.

If the error amount of the interpolation error is small, the error amount and the phase errors Pd can be considered to be substantially in proportion to one another. Accordingly, only correction data for a specific phase error Pd is stored in advance so that correction data for other phase errors Pd can be obtained by multiplying the correction data for the specific phase error Pd0 by the percentage of the phase errors. Thus, the phase errors Pd can be limited to reduce the quantity of correction data stored.

Figure 13:
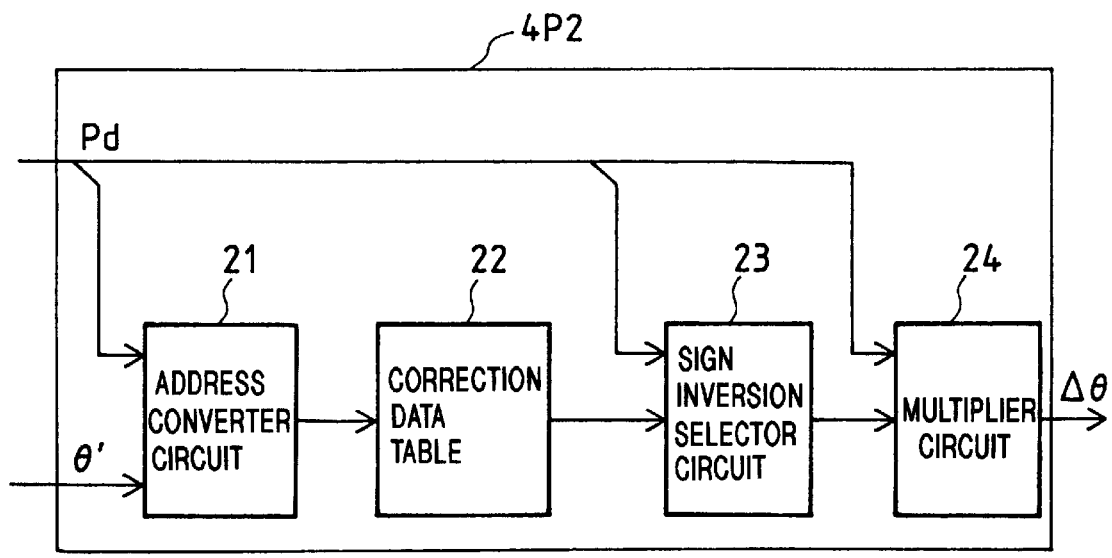
FIG. 13 is a block diagram for illustrating elements constituting correction data storage means in the encoder interpolation circuit of FIG. 10.

The block diagram of FIG. 13 illustrates the configuration of the correction data storage unit 4p2 for storing the correction data by limiting the range of the interpolation data $\theta'$ and the phase errors Pd. In FIG. 13, the correction data storage unit 4p2 comprises an address converter circuit 21, correction data table 22, sign inversion selector circuit 23, and multiplier circuit 24. The address converter circuit 21 receives the interpolation data $\theta'$ and the phase errors Pd and forms addresses. The correction data table 22 is loaded only with the correction data corresponding to combinations of the interpolation data $\theta'$ in the limited range and the limited phase errors Pd, and the correction data are read out from the table 22 in response to address assignment by the address converter circuit 21. The sign inversion selector circuit 23 inverts the sign of the read correction data in accordance with the phase errors Pd. The multiplier circuit 24 multiplies the correction data by the phase errors Pd.

Figure 14:
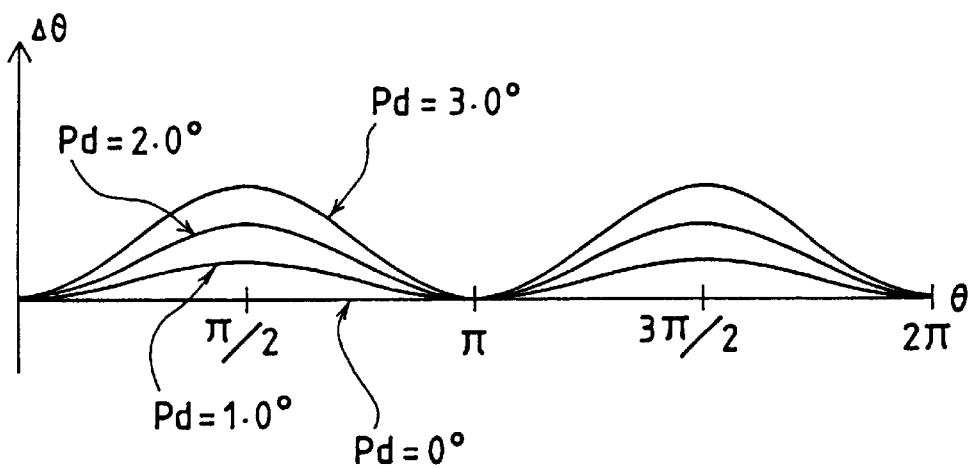
FIG. 14 is a diagram schematically showing correction data patterns for canceling the error shown in FIG. 12 according to the error attributable to the phase difference.
Figure 15:
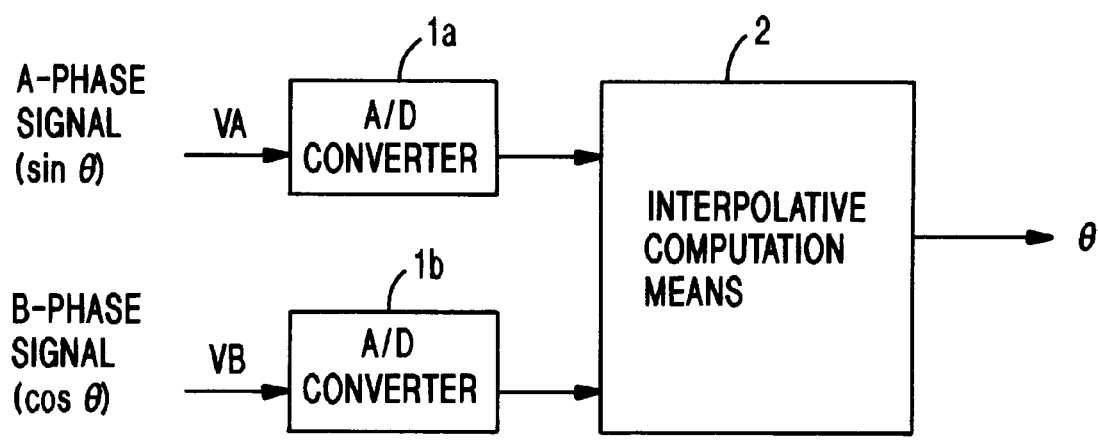
FIG. 15 is a diagram for illustrating a conventional encoder interpolation circuit.

FIG. 14 is a diagram showing relations between correction data $\Delta\theta$ for the interpolation error based on the phase errors Pd and the interpolation data $\theta'$. Referring to FIG. 14, each correction data $\Delta\theta$ has a size and sign such as to cancel the interpolation error $\delta\theta$ shown in FIG. 12. Since, the correction data $\Delta\theta$ within the range of $\theta=0$ to $\pi$ is symmetrical with the correction data $\Delta\theta$ within the range of $\theta=\pi$ to $2\pi$, the correction data $\Delta\theta$ within the range of $\theta=\pi$ to $2\pi$ can be obtained from the stored corrected data within the range of $\theta=0$ to $\pi$.

Further, the correction data $\Delta\theta$, which changes its size depending on the phase errors Pd, can be considered to be substantially proportional to the percentage of the phase errors Pd when the phase errors Pd are small. The correction data $\Delta\theta$ is stored as a representative value for a specific phase error Pd, and the other phase errors Pd can be obtained by multiplication. FIG. 14 illustratively shows cases for Pd=1.0°, Pd=2.0°, and Pd=3.0°. For example, only the correction data $\Delta\theta$ for Pd=1.0° is stored, and the correction data for the other phase errors Pd can be obtained by multiplying the correction data $\Delta\theta$ by the ratio to Pd=1.0° as a multiplication factor. Here Pd=0° indicates that there is no phase error between the two encoder signals.

The address converter circuit 21 is a circuit that receives the computed interpolation data $\theta'$ and the detected phase errors Pd, and forms addresses for reading out the correction data table 22. In forming the addresses, the addresses are outputted depending on the range of $\theta'$ and the sign, positive or negative, of the phase errors Pd, with $0\leq\theta'<\pi$ as a unit, as shown in Table 3 below.

Further, the sign inversion selector circuit 23 does or does not invert the sign of the data read out from the correction data table 22, depending on the range of the computed interpolation data $\theta'$ and the sign, positive or negative, of the phase errors Pd, as shown in Table 3.

TABLE 3

| $\theta'$ | Sign of Pd | Address to Data Table | Sign of Output Data |
|---|---|---|---|
| $0 \leq \theta' < \pi$ | Positive | $\theta'$ | Non-inverted |
|  | Negative | $\pi - \theta'$ | Inverted |
| $\pi \leq \theta' < 2\pi$ | Positive | $\theta' - \pi$ | Non-inverted |
|  | Negative | $2\pi - \theta'$ | Inverted |

Further, the multiplier circuit 24 is a circuit that multiplies the correction data stored for the specific phase error Pd by a multiplication factor of a percentage corresponding to a phase error Pd. Table 4 below shows examples of the multiplication factors. The correction data is stored in advance as a reference for the phase error Pd=1.0°, and correction data for different phase errors Pd are obtained by multiplication by a specific multiplication factor which is determined with reference to the multiplication factor for the phase error Pd=1.0°.

TABLE 4

| \|Pd\| | Coefficient of Multiplication |
|---|---|
| 0° ≦ \|Pd\| < 0.5° | 0 |
| 0.5° ≦ \|Pd\| < 1.5° | 1 |
| 1.5° ≦ \|Pd\| < 2.5° | 2 |
| 2.5° ≦ \|Pd\| < 3.5° | 3 |
| 3.5° ≦ \|Pd\| | 4 |

In the case where the phase error Pd ranges from 1.5° to 2.5°, for example, the correction data for the phase error Pd=1.0° is multiplied by a multiplication factor of 2. In the case where the phase error Pd ranges from 2.5° to 3.5°, the correction data Δθ is obtained by multiplying the correction data for the phase error Pd=1.0° by a multiplication factor of 3.

In a method of multiplication in the multiplier circuit 24, moreover, the correction data Δθ may be obtained by storing the correction data table 22 with only correction data for a specific phase error, and multiplying the read correction data by a factor that is determined by the ratio of the specific phase error to the detected phase error in the case where the specific error and the detected phase error have the same sign or multiplying the read correction data by a factor that is determined by the ratio of the specific phase error to the detected phase error and inverting the sign of the product in the case where the specific error and the detected phase error have different signs.

In a method of multiplication in the multiplier circuit 24, furthermore, the correction data Δθ may be obtained by storing the correction data table 22 with first correction data for a positive specific phase error and second correction data for a negative specific phase error, multiplying the correction data read out from the first correction data by a factor determined by the ratio of the positive specific phase error to the detected phase error when the detected phase error is positive or multiplying the correction data read out from the second correction data by a factor determined by the ratio of the negative specific phase error to the detected phase error when the detected phase error is negative.

In the embodiment described above, the signal deviation detecting means (amplitude ratio detecting means or phase error detecting means) is incorporated in the encoder interpolation circuit. Alternatively, however, the signal deviation detecting means may be provided outside the encoder interpolation circuit. For example, deviations from a normal waveform may be detected by fetching encoder signals by means of external synchronization or the like. The result of this detection is applied to the input of the correction data forming means.

According to the present invention, as described above, the interpolation error attributable to the amplitude difference and the interpolation error attributable to the phase error can be reduced during the generation of interpolation data.

What is claimed is:

1. An encoder interpolation circuits comprising:
    an interpolative computation unit receiving two encoder signals of difference phases, carrying out interpolative computation for these signals and outputting interpolation angle data;
    a correction data forming unit obtaining and outputting correction data corresponding to a combination of a detected deviation of the two encoder signals from a normal waveform and the interpolation angle data outputted from said interpolative computation unit; and
    a corrective computation unit correcting the interpolation angle data outputted from said interpolative computation unit with the correction data outputted from said correction data forming unit and outputting corrected interpolation angle data.

2. An encoder interpolation circuit according to claim 1, wherein said correction data forming unit forms the correction data by inputting the interpolation angle data and said detected deviation of the two encoder signals individually into variables of a computational expression for obtaining correction data, and operating the communicational expression.

3. An encoder interpolation circuit comprising:
    an interpolative computation unit receiving two encoder signals of difference phases, carrying out interpolative computation for these signals and outputting interpolation angle data;
    a correction data forming unit obtaining and outputting correction data corresponding to a combination of a detected deviation of the two encoder signals from a normal waveform and the interpolation angle data outputted from said interpolative computation unit; and
    a corrective computation unit correcting the interpolation angle data outputted from said interpolative computation unit with the correction data outputted from said correction data forming unit and outputting corrected interpolation angle data,
    wherein said correction data forming unit is previously stored with the value of correction data for a combination of the output of said interpolative computation unit and the output of said correction data forming unit, and said correction data forming unit receives the output of the interpolative computation unit and the output of the correction data forming unit and outputs the previously stored value of the correction data corresponding to the combination of these outputs.

4. An encoder interpolation circuit according to claim 3, wherein said correction data stored in said correction data forming unit can be fetched with an address which represents a combination of the output of said interpolative computation unit and the output of said correction data forming unit.

5. An encoder interpolation circuit according to claim 3, wherein said correction data forming unit is stored with a data table so that corresponding data can be fetched with an address which represents a combination of angle data in a limited range and a detected signal deviation, and said correction data forming unit receives the detected deviation of the two encoder signals and the output of the interpolative computation determines an address based on the deviation and the output, and forms said correction data by accessing said data table to fetch the corresponding data with the determined address and processing the fetched data.

6. An encoder interpolation circuit according to claim 3, wherein said correction data forming unit is stored with correction data corresponding to a reference signal deviation value and angle data in a limited range, and said correction data forming unit forms said correction data by receiving the detected deviation of the two encoder signals and output of the interpolative computation unit, fetches corresponding data from said stored correction data based on the output and the deviation, and carrying out processing including processing in accordance with of the relation between said reference signal deviation value and said detected signal deviation.

7. An encoder interpolation circuit comprising:
    an interpolative computation unit receiving two encoder signals of difference phases, carrying out interpolative computation for these signals and outputting interpolation angle data;

a correction data forming unit obtaining and outputting correction data corresponding to a combination of a detected deviation of the two encoder signals from a normal waveform and the interpolation angle data outputted from said interpolative computation unit; and a corrective computation unit correcting the interpolation angle data outputted from said interpolative computation unit with the correction data outputted from said correction data forming unit and outputting corrected interpolation angle data, wherein said deviation of the two encoder signals is the ratio of the amplitude of one sine-wave encoder signal to the amplitude of the other sine-wave encoder signal.

8. An encoder interpolation circuit according to claim 7, wherein said correction data forming unit forms the correction data by substituting an output of said interpolative computation unit and a detected amplitude ratio, as a detected deviation of the two encoder signals individually for variables in a predetermined computational expression for obtaining correction data and operating the communicational expression.

9. An encoder interpolation circuit according to claim 7, wherein said correction data forming unit is stored with data in a table form capable of being fetched with an address representing a combination of the amplitude ratio and the angle data, and said correction data forming unit determines said address based on the received deviation of the two encoder signals and the output of the interpolative computation unit, fetches data from said table according to the determined address, and outputs the correction data based on the fetched data.

10. An encoder interpolation circuit according to claim 9, wherein said angle data constituting said address ranges from 0 to $\pi/2$.

11. An encoder interpolation circuit according to claim 9, wherein said correction data forming unit stores first correction data for a specific amplitude ratio k1 in the case where the amplitude of one encoder signal is greater than the amplitude of the other encoder signal and second correction data for a specific amplitude ratio k2 in the case where the amplitude of the one encoder signal is smaller than the amplitude of the other encoder signal, and multiplies the first correction data by $(1-k)/(1-k1)$ when the detected amplitude ratio k is higher than 1 or multiplies the second correction data by $(1-k)/(1-k2)$ when the detected amplitude ratio k is lower than 1.

12. An encoder interpolation circuit according to claim 9, wherein said correction data forming unit stores only correction data for a specific amplitude ratio k1 in the case where the amplitude of one encoder signal is greater than the amplitude of the other encoder signal, and multiplies the first correction data by $(1-k)/(1-k1)$ when the detected amplitude ratio k is higher than 1 or multiplies the correction data by $-(1-k)/(1-k1)$ when the detected amplitude ratio k is lower than 1.

13. An encoder interpolation circuit according to claim 1, wherein said deviation of the two encoder signals is a phase error as the difference between the predetermined phase difference between two encoder signals and an actual phase difference between the two encoder signals.

14. An encoder interpolation circuit according to claim 13, wherein said correction data forming unit forms the correction data by substituting an output of said interpolative computation unit and a detected phase error, as a deviation of the two encoder signals, individually for variables in a computational expression for obtaining preset correction data and operating the computational expression.

15. An encoder interpolation circuit according to claim 13, wherein said correction data forming unit is stored with data in a table form capable of being fetched with an address representing a combination of said phase error and the angle data, and said correction data forming unit determines said address based on the received phase error, as the deviation of the two encoder signals, and output of the interpolative computation unit, fetches data from said table according to the determined address, and outputs the correction data based on the fetched data.

16. An encoder interpolation circuit according to claim 15, wherein said predetermined phase difference between two encoder signals is $\pi/2$, and said angle data constituting said address ranges from 0 to $\pi$.

17. An encoder interpolation circuit according to claim 15, wherein said correction data forming unit stores first correction data for a positive specific phase error and second correction data for a negative specific phase error, and multiplies the first correction data by a factor determined by the positive specific phase error and the detected phase error in the case where the detected phase error is positive or multiplies the second correction data by a factor determined by the negative specific phase error and the detected phase error in the case where the detected phase error is negative.

18. An encoder interpolation circuit according to claim 15, wherein said correction data forming unit stores only correction data for a specific phase error, and multiplies the read correction data by a factor determined by the specific phase error and the detected phase error in the case where the specific error and the detected phase error have the same sign or multiplies the read correction data by a factor determined by the specific phase error and the detected phase error in the case where the specific error and the detected phase error have different signs and inverts the sign.

* * * * *